United States Patent
Kim et al.

(10) Patent No.: US 6,451,456 B1
(45) Date of Patent: Sep. 17, 2002

(54) COMPOUND FOR RED ORGANIC EL DEVICE AND ORGANIC EL DEVICE USING THE SAME

(75) Inventors: Dong-uk Kim, Seoul; Yoon-Heung Tak, Yongin-si, both of (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/298,838

(22) Filed: Apr. 26, 1999

(30) Foreign Application Priority Data

Apr. 30, 1998 (KR) ............................................ 98-15694

(51) Int. Cl.[7] .......................... H05B 33/14; C09K 11/06
(52) U.S. Cl. ...................... 428/690; 428/917; 313/504; 252/301.16
(58) Field of Search ................................ 428/690, 704, 428/917; 313/504, 506; 252/301.16, 301.22, 301.32; 549/356, 427; 564/305

(56) References Cited

U.S. PATENT DOCUMENTS

| | | | | |
|---|---|---|---|---|
| 2,965,486 A | * | 12/1960 | Brooker et al. | |
| 3,852,683 A | * | 12/1974 | Webster et al. | |
| 4,145,215 A | * | 3/1979 | Van Allan et al. | |
| 4,769,292 A | * | 9/1988 | Tang et al. | 428/690 |
| 5,281,489 A | * | 1/1994 | Mori et al. | 428/690 |

FOREIGN PATENT DOCUMENTS

JP        11-335661        * 12/1999

OTHER PUBLICATIONS

G. A. Lindsay et al., "Second harmonic generation from new dyes in polymer films", SPIE vol. 2143, pp. 88–98, 1994.*

* cited by examiner

*Primary Examiner*—Marie Yamnitzky
(74) *Attorney, Agent, or Firm*—Fleshner & Kim, LLP

(57) ABSTRACT

Compound for a red organic EL device and an organic EL device using the same, which can improve an luminance efficiency, an emitting light color and a device stability, the compound of the following structural formula:

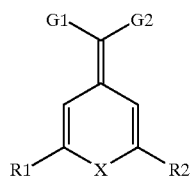

1) Wherein G1 and G2 are identical or different electron withdrawing groups except a case when both of G1 and G2 are cyano groups, or G1 and G2 are electron withdrawing groups interconnected with a molecular chain to form a cyclic compound or a heterocyclic compound;

2) And, wherein the R1 or the R2 is any one selected from a substituted or unsubstituted alkyl group (with 1~5 carbons), a substituted or unsubstituted aryl group and —CH=CH—A1, the chemical formula A1 being a 4-dialklyamino-phenyl, a 4-dialkylamino-2-alkoxyphenyl, a julolidine, an 8-alkoxy julolidine, a diphenylaminophenyl, a diphenylaminophenyl having an alkyl group substituted therein, or a diphenylaminophenyl having an alkoxy group substituted therein where the alkyl or the alkoxy has 1~5 carbons;

3) And, wherein X is O, N, Se or S.

4 Claims, 4 Drawing Sheets

COMPOUND FOR RED ORGANIC EL DEVICE AND ORGANIC EL DEVICE USING THE SAME

BACKGROUND OF THE INVENTION

1. Field of the Invention

The present invention relates to a display, and more particularly, to a material for a red organic electroluminescence(EL) device and an organic EL device using the same.

2. Background of the Related Art

As sizes of displays become the larger, demand for a flat display which occupy less spaces increase, as one of which there is the electroluminescence device. There are an inorganic electroluminescence device and an organic electroluminescence device depending on materials used therein. The inorganic electroluminescence device is provided with a light emitting unit to which a high electric field is applied for accelerating electrons, so that the electrons collide onto and excite a luminescent center therein to emit a light. And, the organic electroluminescence device is provided with an electron injection electrode(cathode) and a hole injection electrode(anode) from which electrons and holes are injected into the light emitting unit, so that the injected electrons and the holes are coupled into exciton, to emit a light when the exciton drops from an exited state to a ground state. While the inorganic electroluminescence device that requires a strong electric field due to the above operation principle requires a relatively high driving voltage of approx. 100~200V, because the organic electroluminescence device has an advantage in that it is operable at a low voltage of 5~20V, there have been active studies on the organic electroluminescence device. Besides, as the organic electroluminescence device has excellent characteristics, such as a wide angle of view, a fast response speed and a high contrast so on, the organic electroluminescence device can be used as a pixel of a graphic display, or a TV image display or a surface light source, and as the organic electroluminescence device is thin and light and has a good sense of color, the organic electroluminescence device is suitable for a flat display of the next generation.

A structure of a related art organic electroluminescence device will be explained.

The related art organic electroluminescence device is provided with a first electrode formed on a transparent substrate, a hole injection and transport layer formed on the first electrode, a light emitting layer formed on the hole injection and transport layer, an electron injection and transport layer formed on the light emitting layer, and a second electrode formed on the electron injection and transport layer. Considering the operation of electroluminescence devices as consisting of two processes, firstly formation of the exciton(pair of electron-hole) and secondly its decay, the former involves i)carrier injection, ii)carrier transport and iii)carrier recombination, while the latter encompasses a competition between radiative and non-radiative decay channels. Since the disclosure of the organic electroluminescence device by Kodak in 1987, many researchers in the world from Japan, the U. K, and the U.S.A. and etc., participate in the practical application and development of the organic electroluminescence device. Currently, though many studies are underway for materials of the organic EL device, the following materials are in general used as the organic EL device.

The hole transport layer is formed of triphenylamine derivatives, such as N,N'-diphenyl-N,N'-bis(3-methylphenyl)-(1,1'-biphenyl)-4,4'-diamine(TPD) or N,N'-dinaphthyl-N,N'-phenyl-(1,1'-biphenyl)-4,4'-diamine (NPD). And, the electron transport layer is in general formed of alkyl metal complex, such as tris(8-hydroxy quinolate) aluminum($Alq_3$). The organic light emitting layer is formed of $Alq_3$ as base with dopant of organic EL dyes for adjusting color of lights. In the meantime, a red EL device, a green EL device and a blue EL device are required for realization of a full color display, wherein coumarine 6 or quinacridone derivatives are used as dopants in a case of the green EL device, and DCM(4-dicyanomethylene- 2-p-dimethylaminostyryl-6-methyl-4H-pyran) derivatives are used as dopants in a case of the red EL device.

However, the related art organic EL device has the following problems.

It is known that a stability of the green EL device has reached to a practicable level. However, in the cases of the blue EL device and the red EL device, colors of emitted lights and stabilities are not reached to practicable levels and luminance efficiencies are also not reached to a satisfactory level.

SUMMARY OF THE INVENTION

Accordingly, the present invention is directed to a material for a red organic EL device and an organic EL device using the same that substantially obviates one or more of the problems due to limitations and disadvantages of the related art.

An object of the present invention is to provide a material for a red organic EL device and an organic EL device using the same, which can improve an luminance efficiency, an emitting light color and a device stability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided the compound of the following structural formula:

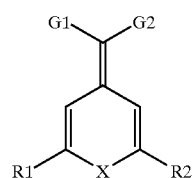

1) Wherein G1 and G2 are identical or different electron withdrawing groups except a case when both of G1 and G2 are cyano groups, or G1 and G2 are electron withdrawing groups interconnected with a molecular chain to form a cyclic compound or a heterocyclic compound;

2) And, wherein the R1 or the R2 is any one selected from a substituted or unsubstituted alkyl group (with 1~5 carbons), a substituted or unsubstituted aryl group and —CH=CH—A1, the chemical formula A1 being a 4-dialklyamino-phenyl, a 4-dialkylamino-2-alkoxyphenyl, a julolidine, an 8-alkoxy julolidine, a diphenylaminophenyl, a diphenylaminophenyl having an alkyl group substituted therein, or a diphenylaminophenyl having an alkoxy group substituted therein where the alkyl or the alkoxy has 1~5 carbons;

3) And, wherein X is O, N, Se or S.

In another aspect of the present invention, there is provided an organic electroluminescence device having a first electrode, a second electrode and a stack of a plurality of organic layers, including a light emitting layer of a compound with the aforementioned structural formula.

In further aspect of the present invention, there is provided an organic electroluminescence device having a first electrode, a second electrode and a stack of a plurality of organic layers, including a light emitting layer doped with a compound with the aforementioned structural formula.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
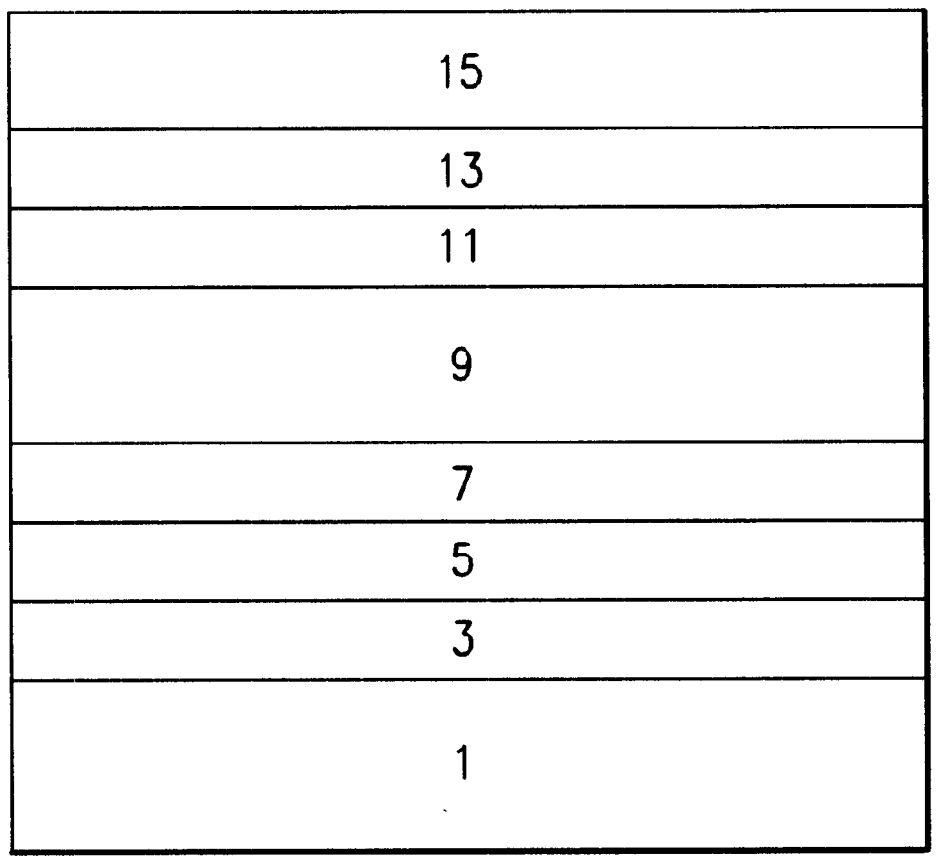
FIG. 1 illustrates a section showing an organic EL device having a material in accordance with a preferred embodiment of the present invention applied thereto.

The present invention suggests to modify a structure of DCM(4-dicyanomethylene-2-p-dimethylaminostyryl-6-methyl-4H-pyran), i.e., to modify electron withdrawing group and electron donating group, to provide a compound of the following formula.

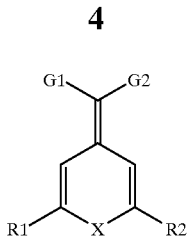

1) Wherein, G1 and G2 are identical or different electron withdrawing groups except a case when both of G1 and G2 are cyano groups, or electron withdrawing groups interconnected with a molecular chain to form a cyclic compound or a heterocyclic compound. The identical or different electron withdrawing groups of G1 and G2 except a case when both of G1 and G2 are cyano groups are preferably materials selected independently from cyano, acyl, alkylcabonyl, alkoxycarbonyl, nitroaryl, cyanoaryl, alkylsulfonyl, fluorsulfonyl, nitro, oxadiazoyl, thiadiazoyl, triazoyl, N-substituted triazoyl, benzoxazoyl, benzodiazoyl, or benzothiazoyl. And, the electron withdrawing groups of G1 and G2 interconnected with a molecular chain to form a cyclic compound or a heterocyclic compound are preferably materials selected from 1,3-indandione, 1,3-cyclohexanedione, 5,5-dimethyl-1,3-cyclohexanedione, 1,3-dioxane-4,6-dione, 2-isoxanzoline-5-one, 2-thiobarbituric acid, barbituric acid, 1,3-dialkyl-2-thiobarbituric acid, 1,3-dialkyl-barbituric acid, pyrazolinone, isoxazolinone, oxindole, 2,4,6-triketohexahydropyrimidine, 2-thio-2,4-thiazolidinedinone, thianaphthenone, 2-thio-2,5-thiazolidinedione, 2,4-thiazolidinedione, thiazolidinone, 4-thiazolinone, 1-amino-2-oxazolin-4-one, 2,4-imidazolidinedione, 2-thio-2,4-imidazolidinedione, 2-imidazolin-5-one and furan-5-one. The electron withdrawing groups of G1 and G2 interconnected with a molecular chain to form a cyclic compound or a heterocyclic compound are more preferably materials selected from the following structural formulae.

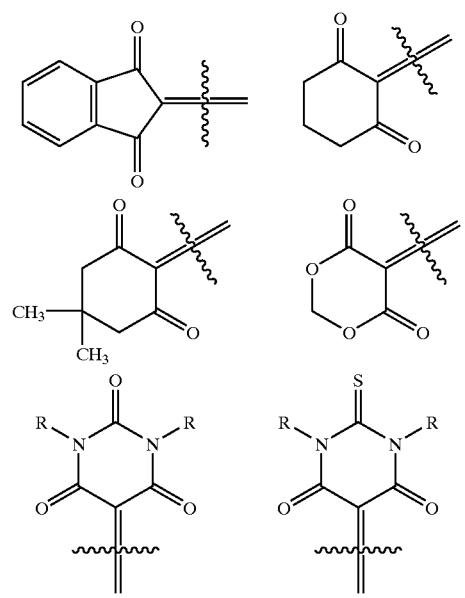

Where, R in the structural formulae of the electron withdrawing groups is an alkyl group with 1~5 carbons or hydrogen. And, 1,3-indandione which is the electron withdrawing groups of G1 and G2 interconnected with a molecular chain may have one or more than one selected from a substituted or unsubstituted alkyl group(with 1~15 carbons), a alkoxy group(with 1~15 carbons), a substituted or unsubstituted aryl group, a halogen group, an alkylsulfuric group (the alkyl with 1~15 carbons), an alkylsulfuric group, an alkylamino group (the alkyl with 1~15 carbons), an arylamino group, and a cyano group, substituted therein. The substituted 1,3-indandione has the following structural formula, where R and R' is the foregoing substituted group.

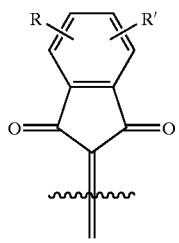

2) And, wherein the R1 or the R2 is any one selected from a substituted or unsubstituted alkyl group (with 1~5 carbons), a substituted or unsubstituted aryl group and —CH═CH—A1. The chemical formula A1 is a 4-dialklyamino-phenyl, a 4-dialkylamino-2-alkoxyphenyl, a julolidine, an 8-alkoxy julolidine, a diphenylaminophenyl, a diphenylaminophenyl having an alkyl group substituted therein, or a diphenylaminophenyl having an alkoxy group substituted therein where the alkyl or the alkoxy has 1~5 carbons. The A1 is preferably selected from the following substituents.

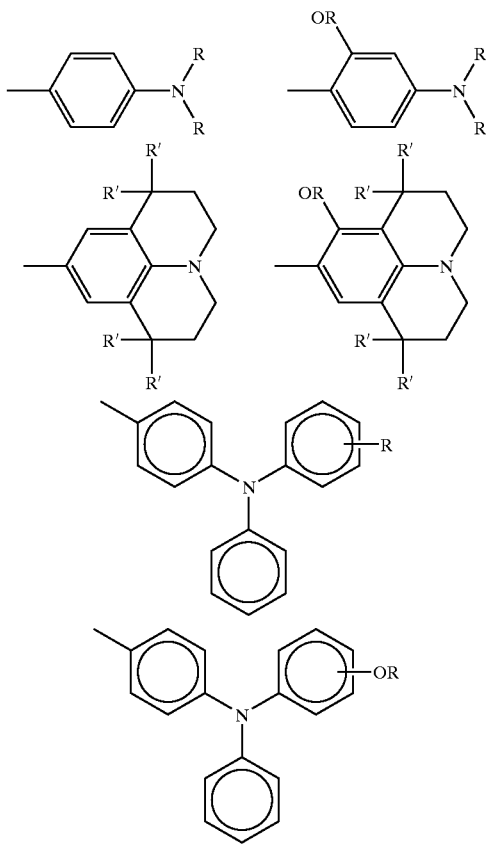

Where, R in above structural formulae is an alkyl group with 1~5 hydrogens or carbons, and R' is a hydrogen or methyl group.

3) And, wherein X is O, N, Se or S. In this instance, the nitrogen atom may have a substituted or unsubstituted alkyl group, a substituted or unsubstituted aryl group, aralkyl, cycloalkyl, alkenyl, hydroxy, alkoxy, aryloxy, or halogen, substituted therewith.

The compound of the present invention for organic EL device may be used as a material for forming a light emitting layer or as a dopant to be doped in the light emitting layer. When the compound is used as the dopant, the compound of the present invention is vacuum deposited on $Alq_3$ and the like as a base in a mass ratio of 0.0001–50% to $Alq_3$, to form the light emitting layer.

EXAMPLES

The present invention and advantages thereof will be further explained in detail by way of examples.

SYNTHESIS

Example 1

Synthesis of 4-(1',3'-Indandione)-2,6-dimethyl-4H-pyran

As one of compounds of the present invention, there is 4-(1',3'-indandione)-2-p-dimethylaminostyryl-6-methyl-4H-pyran(called "Rd-1") having one electron withdrawing group of 1,3-indandione and one electron donating group of tertiary amine.

The Rd-1 may be prepared according to the following process. 2,6-dimethyl-γ-pyran 0.85 g and 1,3-indandione 1 g are dissolved in acetic anhydride solvent 20 ml and make reaction at a reflux temperature for 24 hours, to obtain 4-(1',3'-indandione)-2,6-dimethyl-4H-pyran 0.9 g. Instead of the acetic anhydride, other solvents may be used. Both the prepared intermediate compound 4-(1',3'-indandione)-2,6-dimethyl-4H-pyran 0.5 g and p-dimethylaminobenzaldehyde 0.38 g are dissolved in 10 ml ethanol solvent, 0.3 ml piperidine is dropped thereto, left for 24 hours at 90° C. for reaction, to obtain 0.2 g of 4-(1',3'-indandione)-2-p-dimethylaminostyryl-6-methyl-4H-pyran, i.e., "Rd-1". In this instance, other polar solvents including alcohol solvent may be used instead of the ethanol solvent, and other base may be used instead of the piperidine. The prepared compound is dark violent colored solid. A molecular structure of the Rd-1 is known by NMR and elementary analysis. NMR($CDCl_3$); N—$(CH_3)_2$(2.1 6 ppm, s, 6H), —$CH_3$(3.04 ppm, s, 3H), aromatic and vinylic H (6.50–8.50 ppm, m, 12H). Elementary analysis: actual measurement: C(80.6%), H(6,2%), N(3.7%), calculation; C(78.3%), H(5.5%), N(3.7%).

Vacuum sublimation may be used to refine the prepared Rd-1 for use in the organic EL device. The 1,3 indandione group and the amino group in the Rd-1, with opposite properties, interact to each other through a covalent bond, to provide a quantum efficiency better than the related art DCM derivatives and light emission peaks of which a color purity of emitted light in a red wavelength band is improved.

Example 2

Synthesis of 4-(Dimethylbarbituric acidic)-2-p-dimethylaminostyryl-6-methyl-4H-pyran As another embodiment of the present invention, 4-(dimethylbarbituric acidic)-2-p-dimethylaminostyryl-6-methyl-4H-pyran having one electron withdrawing group of 1,3-dimethyl-barbituric acid and one electron donating group of tertiary amine is prepared, wherein the 1,3-dimethyl-barbituric acid and the tertiary amine, with opposite properties, interact to each other through a covalent bond, to provide a quantum efficiency better than the related art DCM derivatives and light emission peaks of which a color purity of emitted light in a red wavelength band is improved.

The above compound may be prepared according to the following process.

Both 5.3 g of 2,6-dimethyl-γ-pyran and 5.3 g of dimethyl barbituric acid are dissolved in 50 ml acetic anhydride solvent, left for 5 min. at 25° C.~reflux temperature for reaction, to obtain 4-(dimethylbarbituric acidic)-2,6-dimethyl-4H-pyran. Both the prepared 4-(dimethylbarbituric acidic)-2,6-dimethyl-4H-pyran 0.3 g and p-dimethylaminobenzaldehyde 0.17 g are dissolved in ethanol solvent 15 ml, and piperidine 0.3 ml is dropped thereto, and left for reaction for more than 5 min. at 25° C. reflux temperature, to obtain 4-(dimethylbarbituric acidic)-2-p-dimethylaminostyryl-6-methyl-4H-pyran 0.7 g. The prepared compound is dark violet colored solid. A molecular structure of the compound is known by NMR and elementary analysis. NMR(CDC13); N—$(CH_3)_2$ (2.18 ppm, s, 6H), C—$CH_3$ (3.04 ppm, s, 3H), CON—$CH_3$ (3.05 ppm 3H), CON-$CH_3$ (3.40 ppm, s, 3H), aromatic and vinylic H (6.50~9.00 ppm, m, 8H). Elementary analysis: actual measurement; C(70.3%), H(6.7%) and N(1 1.2%), calculation; C(67.2%), H(5.9%) and N(10.7%).

Other compounds not explained herein may be prepared by similar processes.

FABRICATION AND PERFORMANCE OF EL DEVICE

Example 3

The Steps of Fabrication

One embodiment organic EL device having the compound of the present invention applied thereto may be fabricated according to the following steps.

(1) A first electrode is formed on a transparent substrate to a thickness of approx. 100 nm.

(2) A hole injection layer of copper phthalocyanine(CuPc) is formed on the first electrode to a thickness of approx. 10 nm 20 nm.

(3) A hole transport layer of N,N'-dinaphthyl-N,N'-phenyl-(1,1'-biphenyl)-4,4'-diamine (NPD) is formed on the hole injection layer to a thickness of approx. 30 nm~50 nm.

(4) An organic Light emitting layer of tris(8-hydroxyquinolate) aluminum(Alq3) is deposited on the hole transport layer to a thickness of approx. 40 nm~60 nm and approx. 1% of dopant is added thereto.

(5) An electron injection layer of an alkali metal or alkali earth metal compound is formed on the organic Light emitting layer having the dopant deposited or not deposited thereon. And, (6) A second electrode is formed on the electron injection layer to a thickness of approx. 100 nm~200 nm. A layer of $Li_2O$ may be formed between the electron injection layer and the second electrode.

Example 4

EL Device with Rd-1 Doped $Alq_3$ Light Emitting Layer

An organic EL device is fabricated as shown in FIG. 1. That is, the organic EL device shown in FIG. 1 includes a transparent substrate 1/a first electrode 3/a hole injection layer 5/a hole transport layer 7/a light emitting layer 9/an electron transport layer 11/an electron injection layer 13/a second electrode 15. The light emitting layer 9 is formed of $Alq_3$ doped with 1% Rd-1. For comparison to the aforementioned organic EL device of the present invention, an identical EL device doped with 1% DCM-2 of the related art, instead of 1% Rd-1 of the present invention, is fabricated.

Example 5

Performance of EL device with Rd-1 doped Light Emitting Layer

The experiments results of which are shown in FIGS. 2~6 are on organic EL devices of Alq3 doped with 1% DCM-2 and 1% Rd-1, respectively.

Figure 2:
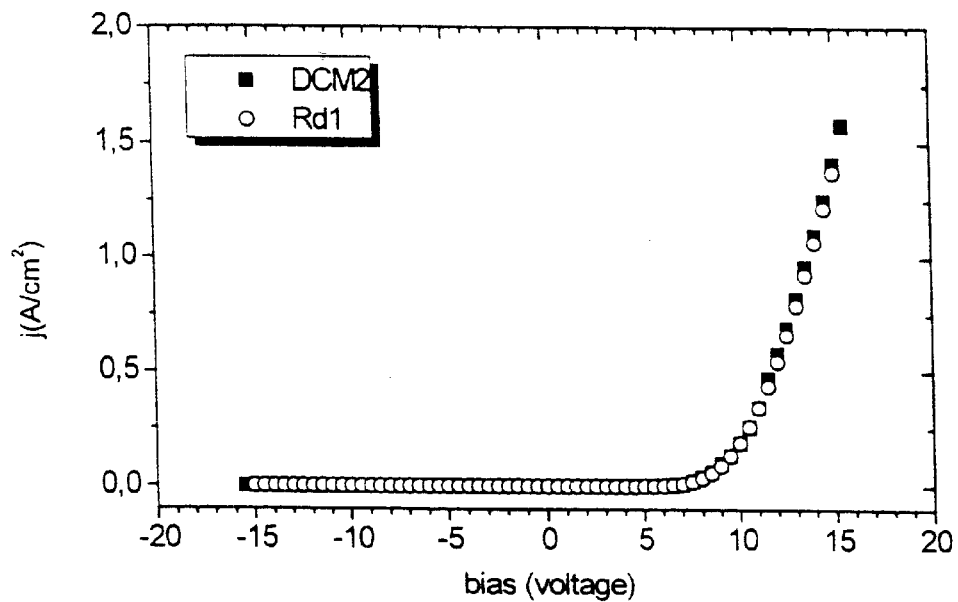
FIG. 2 illustrates a graph showing IV-characteristics of the organic EL device having 4-(1',3'-indandione)-2-p-dimethylaminostyryl-6-methyl-4H-pyran of the present invention and DCM-2 of the related art applied thereto, respectively.
Figure 3:
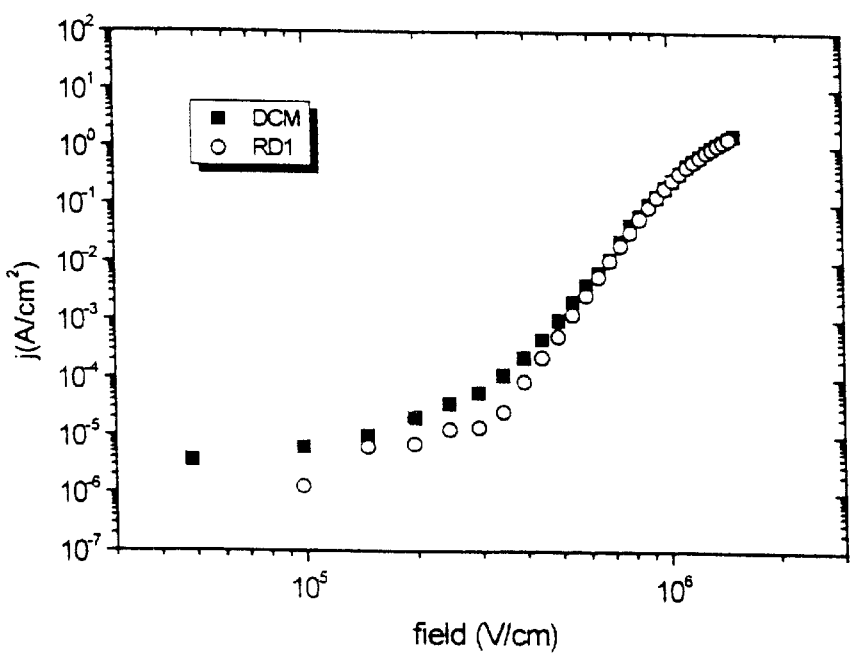
FIG. 3 illustrates a graph showing current densities of the organic EL devices having 4-(1',3'-indandione)-2-p-dimethylaminostyryl-6-methyl-4H-pyran of the present invention and DCM-2 of the related art applied thereto, respectively.

FIG. 2 illustrates a graph showing IV-characteristics of the organic EL device having 4-(1',3'-indandione)-2-p-dimethylaminostyryl-6-methyl-4H-pyran(Rd-1) of the present invention and DCM-2 of the related art applied thereto respectively, wherefrom general characteristics of the organic EL devices can be known. From FIG. 2, it can be known that the IV-curves of the organic EL devices having DCM-2 and Rd-1 applied thereto respectively are typical diode IV-curves.

This can be clearly known from FIG. 2 which illustrates current density curves of the two materials. That is, the devices emit no lights in a negative voltage region, and have 5V of turn on voltages and almost identical current densities. X-axis in FIG. 3 denotes electric fields, and Y-axis denotes current densities. The electric field means a voltage on the device divided by a thickness of the device. It can be known from FIG. 3 that the organic EL devices having DCM-2 and Rd-1 applied thereto respectively have almost identical current densities at a high field over $6 \times 10^6 V/cm^2$ and the organic EL device having Rd-1 applied thereto has a current density slightly lower than the organic EL device having DCM-2 applied thereto at a low field.

Figure 4:
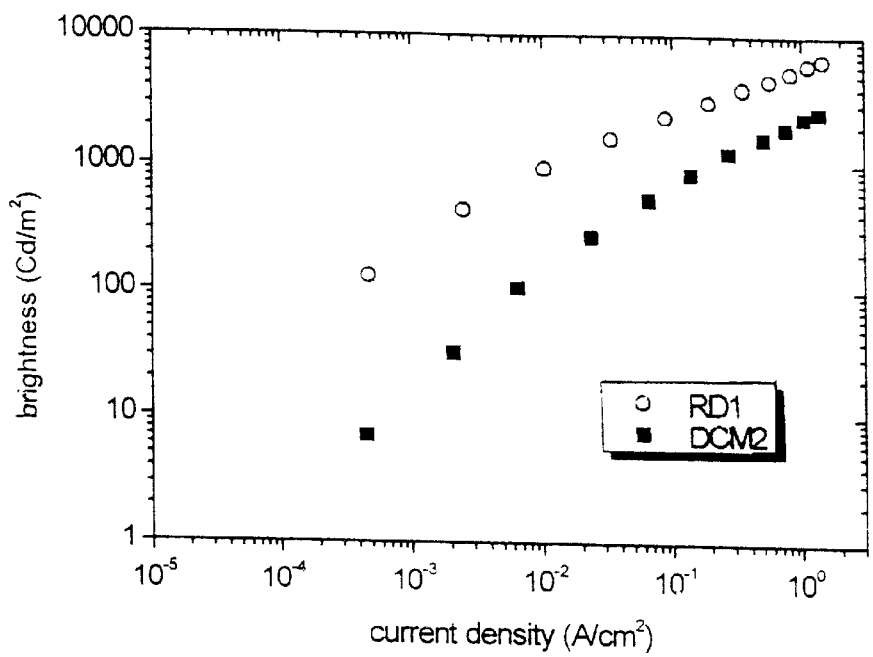
FIG. 4 illustrates a graph showing current density-brightness of the organic EL devices having 4-(1',3'-indandione)-2-p-dimethylaminostyryl-6-methyl-4H-pyran of the present invention and DCM-2 of the related art applied thereto, respectively.

FIG. 4 illustrates a graph showing current density-brightness of the organic EL devices having 4-(1',3'-indandione)-2-p-dimethylaminostyryl-6-methyl-4H-pyran) of the present invention and DCM-2 of the related art applied thereto respectively, wherefrom it can be known that the organic EL device having DCM-2 applied thereto has a brightness of approx. 2500 $cd/m^2$ at a current density of 1 A and the organic EL device having Rd-1 applied thereto has a brightness of approx. 7000 $cd/m^2$ at the same current density. The brightnesses were results of measurements on one pixel with an area of 9 $mm^2$ by a calibrated spectrascan PR650.

Figure 5:
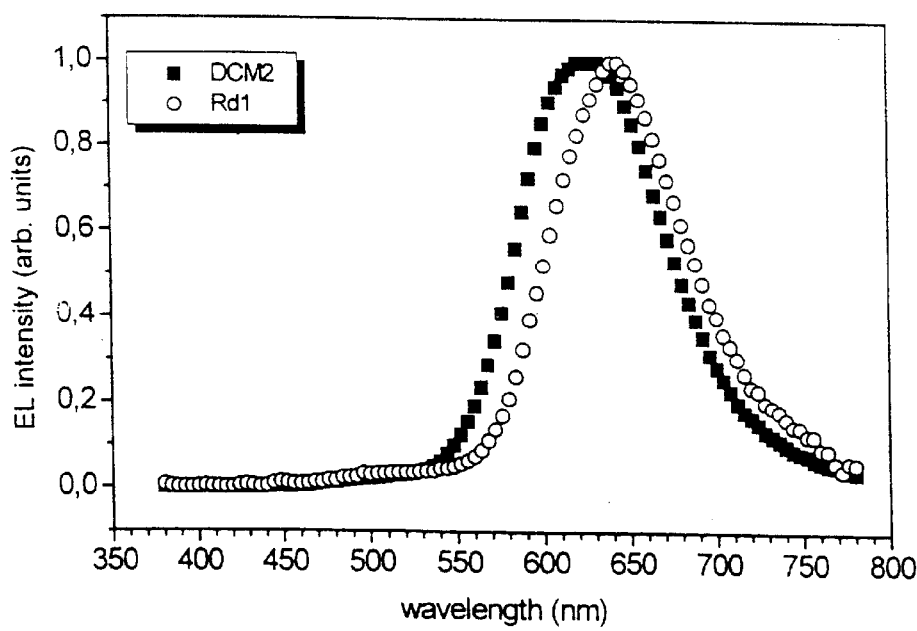
FIG. 5 illustrates a graph showing spectrums of the organic EL devices having 4-(1',3'-indandione)-2-p-dimethylaminostyryl-6-methyl-4H-pyran of the present invention and DCM-2 of the related art applied thereto, respectively.

FIG. 5 illustrates a graph showing spectra of the organic EL devices having 4-( 1',3'-indandione)-2-p-dimethylaminostyryl-6-methyl-4H-pyran(Rd-1) of the present invention and DCM-2 of the related art applied thereto respectively, wherefrom it can be known that the organic EL device having DCM-2 applied thereto has a wavelength($\lambda_{MAX}$) of a light emitted therefrom of 630 nm and the organic EL device having Rd-1 applied thereto has a wavelength of a light emitted therefrom of 650 nm, shifted further toward red color than the case of DCM-2 by approx. 20 nm. It is assumed that this is caused by the stronger electron attraction of indandione in Rd-1 than cyano in DCM-2, that drops a conduction band of Rd-1 to be lower than the DCM-2 and, in turn, makes an internal blocking barrier, which is formed by the conduction band of a substance and holds electrons to stay within an internal boundary, of Rd-1 greater, to accumulate more electrons therein to provide a greater probability of hole-electron coupling compared to DCM-2, thereby improving a brightness of Rd-1 and shifting a wavelength of a light emitted from the Rd-1 toward a red wavelength by approx. 20 nm than DCM-2 due to such a band gap. And, in view of structures, because the substituent of Rd-1 is more three-dimensional and larger than DCM-2, the device with Rd-1 has a longer lifetime.

Figure 6:
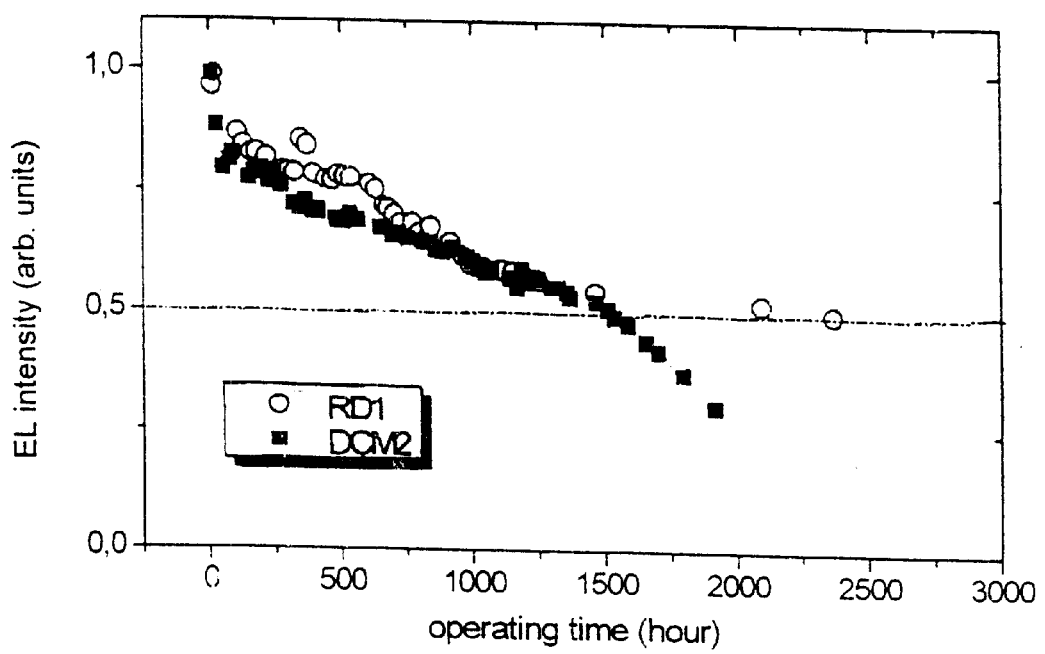
FIG. 6 illustrates a graph showing lifetimes of the organic EL devices having 4-(1',3'-indandione)-2-p-dimethylaminostyryl-6-methyl-4H-pyran of the present invention and DCM-2 of the related art applied thereto, respectively.

FIG. 6 illustrates a graph showing lifetimes of the organic EL devices having 4-(1',3'-indandione)-2-p-dimethylaminostyryl-6-methyl-4H-pyran(Rd-1) of the present invention and DCM-2 of the related art applied thereto respectively, tested and measured under the same conditions. The test condition is as follows; A sample driving condition is 70 frames/sec, a duty cycle is 1/40, a forward bias is 14V with a pulse width of 350 μs, a reverse bias is −12V with a pulse width of 44 μs. And, a reverse condition is 1 Hz at a position of a middle of a frame pulse. An operating lifetime is taken as a time period in which an initial brightness drops by half at a room temperature. As a result of the measurements, the operating lifetime of Rd-1 is longer by approx. 700 hours than DCM-2.

Summarizing all the results of measurements, it can be known that the compounds of the present invention is more suitable to a red organic EL device than the DCM of the related art in view of performance and structure, which can be summarized as follows.

Because the compounds of the present invention for an organic EL device have light emission peaks more shifted toward a red wavelength band than DCM group, such as DCM-1 or DCM-2 used as a red light emission material in the related art, an improved color purity can be provided. That is, the organic EL device having the compounds of the present invention applied thereto have light emission peaks closer to a red wavelength band, which difference provides significantly better color purity in red light and a higher light emission efficiency than the related art DCM. Moreover, the compounds of the present invention provide a longer lifetime of the organic EL device when the compounds are applied thereto.

It will be apparent to those skilled in the art that various modifications and variations can be made in the material for a red organic EL device and the organic EL device using the same of the present invention without departing from the spirit or scope of the invention. Thus, it is intended that the present invention cover the modifications and variations of this invention provided they come within the scope of the appended claims and their equivalents.

What is claimed is:

1. A red light emitting layer comprising:

tris(8-hydroxy-quinolate) aluminum ($Alq_3$); and a compound with the following structural formula:

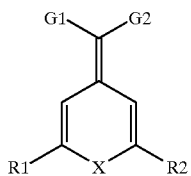

wherein X is O, N, Se or S, and wherein the G1 and G2 are an 1,3-indandione which is electron withdrawing groups interconnected with a molecular chain, the R1 is a methyl group, and the R2 is —CH=CH—A1, where the A1 is 4-dimethylamino-phenyl.

2. An organic electroluminescence (EL) device having a first electrode, a second electrode, a plurality of organic layers, and a light emitting layer comprising:

tris(8-hydroxy-quinolate) aluminum ($Alq_3$); and doped with a compound with the following structural formula:

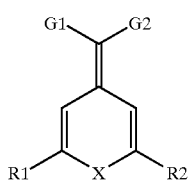

wherein X is O, N, Se or S, and wherein the G1 and G2 are an 1,3-indandione which is electron withdrawing groups interconnected with a molecular chain, the R1 is a methyl group, and the R2 is —CH=CH—A1, where the A1 is 4-dimethylamino-phenyl.

3. The layer as claimed in claim 1, wherein the light emitting layer comprises:

tris(8-hydroxy-quinolate) aluminum ($Alq_3$); and 1 wt. % of the compound.

4. The device as claimed in claim 2, wherein the light emitting layer comprises:

tris(8-hydroxy-quinolate) aluminum ($Alq_3$) doped with about 1 wt. % of the compound.

* * * * *